(12) United States Patent
Liu et al.

(10) Patent No.: US 8,872,628 B2
(45) Date of Patent: Oct. 28, 2014

(54) DOCUMENT WITH INDUCTIVE CHARGING AND DATA STORAGE AND TRANSMISSION

(75) Inventors: Eric Liu, Santa Clara, CA (US); Dustin C Rosing, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 255 days.

(21) Appl. No.: 13/078,163

(22) Filed: Apr. 1, 2011

(65) Prior Publication Data

US 2012/0249304 A1 Oct. 4, 2012

(51) Int. Cl.
*H04Q 5/22* (2006.01)
*G08B 13/14* (2006.01)
*G08B 5/22* (2006.01)
*G08B 23/00* (2006.01)
*H04B 5/00* (2006.01)

(52) U.S. Cl.
CPC ....... *H04Q 5/22* (2013.01); *H04Q 2213/13095* (2013.01)
USPC ........ 340/10.1; 340/572.8; 340/8.1; 340/500; 455/41

(58) Field of Classification Search
CPC ... G06F 3/0484; G06F 3/048; G06K 7/10158; G06K 7/10366; G06K 7/10336; H04B 5/0062; H04B 5/0056; H04M 2250/04; H04W 4/008
USPC .............. 715/225, 738; 340/10.1, 572.8, 8.1, 340/500; 455/41
See application file for complete search history.

(56) References Cited

U.S. PATENT DOCUMENTS

| | | | |
|---|---|---|---|
| 6,827,279 B2 | 12/2004 | Teraura | |
| 7,040,532 B1* | 5/2006 | Taylor et al. | 235/375 |
| 7,065,658 B1 | 6/2006 | Baraban | |
| 7,194,801 B2 | 3/2007 | Jenson | |
| 7,416,121 B2 | 8/2008 | Zimmerman | |
| 7,652,564 B2* | 1/2010 | Otsuki | 340/500 |
| 7,683,761 B2 | 3/2010 | Burghard | |
| 7,843,343 B2* | 11/2010 | Thorn | 340/572.1 |
| 8,207,820 B2* | 6/2012 | Bauchot et al. | 340/8.1 |
| 8,362,877 B2* | 1/2013 | Bauchot et al. | 340/8.1 |
| 8,385,822 B2 | 2/2013 | Chatterjee | |
| 2005/0186903 A1 | 8/2005 | Forbes | |
| 2005/0203914 A1* | 9/2005 | Bryant et al. | 707/10 |
| 2006/0144940 A1* | 7/2006 | Shannon et al. | 235/385 |
| 2006/0208903 A1* | 9/2006 | Loh et al. | 340/572.8 |
| 2006/0293069 A1* | 12/2006 | Patel et al. | 455/466 |
| 2007/0035917 A1 | 2/2007 | Hotelling | |
| 2007/0083381 A1 | 4/2007 | Farrell et al. | |

(Continued)

OTHER PUBLICATIONS

Conabree, D.; Sep. 24, 2003; Ricoh Develops Rewritable Sheet with Embedded Rfid Tag; http://www.mobilemag.com/2003/09/24/ricoh-develops-rewritable-sheet-with-embedded-rfid-tag/.

(Continued)

*Primary Examiner* — George Bugg
*Assistant Examiner* — Munear Akki
(74) *Attorney, Agent, or Firm* — Fulbright & Jaworski LLP

(57) ABSTRACT

Illustrated is a system and method to inductively receive electrical power. Additionally, the system and method includes a non-volatile memory that includes data relating to the system and method, the non-volatile memory supplied with the electrical power. Further, the system and method includes a document into which the coil and the non-volatile memory are embedded.

16 Claims, 15 Drawing Sheets

(56) References Cited

U.S. PATENT DOCUMENTS

| | | | |
|---|---|---|---|
| 2007/0271113 A1* | 11/2007 | Nelson et al. | 705/1 |
| 2008/0018619 A1 | 1/2008 | Slatter et al. | |
| 2008/0153510 A1* | 6/2008 | Sulander et al. | 455/456.3 |
| 2009/0058609 A1* | 3/2009 | Clayman | 340/10.1 |
| 2009/0097846 A1* | 4/2009 | Kozischek et al. | 398/20 |
| 2010/0007466 A1* | 1/2010 | Shoarinejad et al. | 340/10.1 |
| 2010/0075666 A1 | 3/2010 | Garner | |
| 2010/0083012 A1 | 4/2010 | Corbridge | |
| 2010/0173582 A1* | 7/2010 | Han | 455/41.1 |
| 2011/0070826 A1 | 3/2011 | Griffin et al. | |

OTHER PUBLICATIONS

Desiraju, R.; RFID Embedded in a Sheet of Paper: <http://www.morerfid.com/details.php?subdetail=Post&action=details&post_id=255&step=s.

* cited by examiner

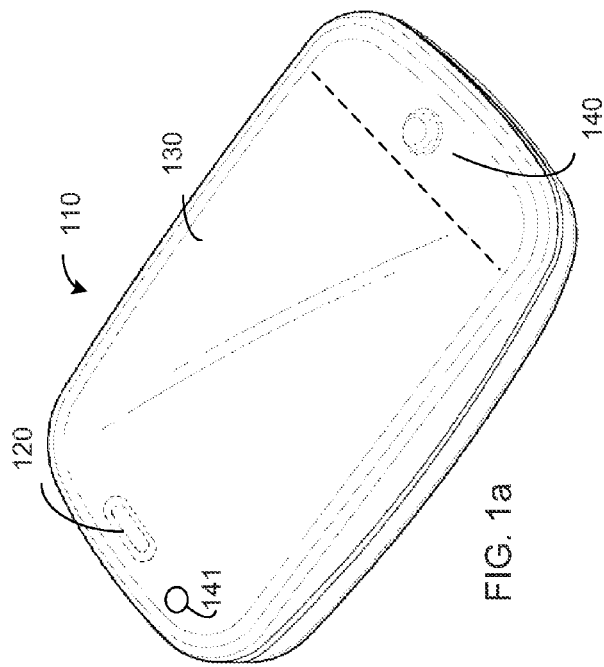
FIG. 1a
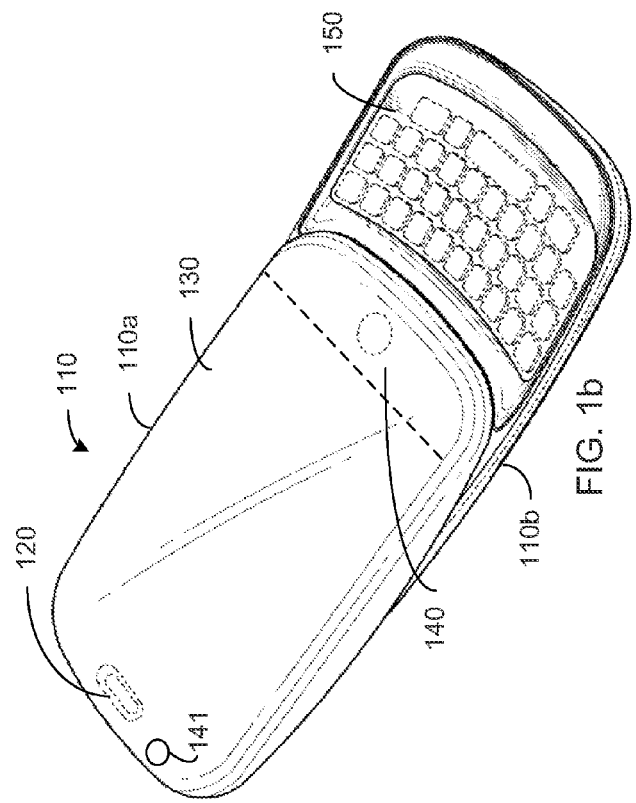
FIG. 1b
FIG. 1

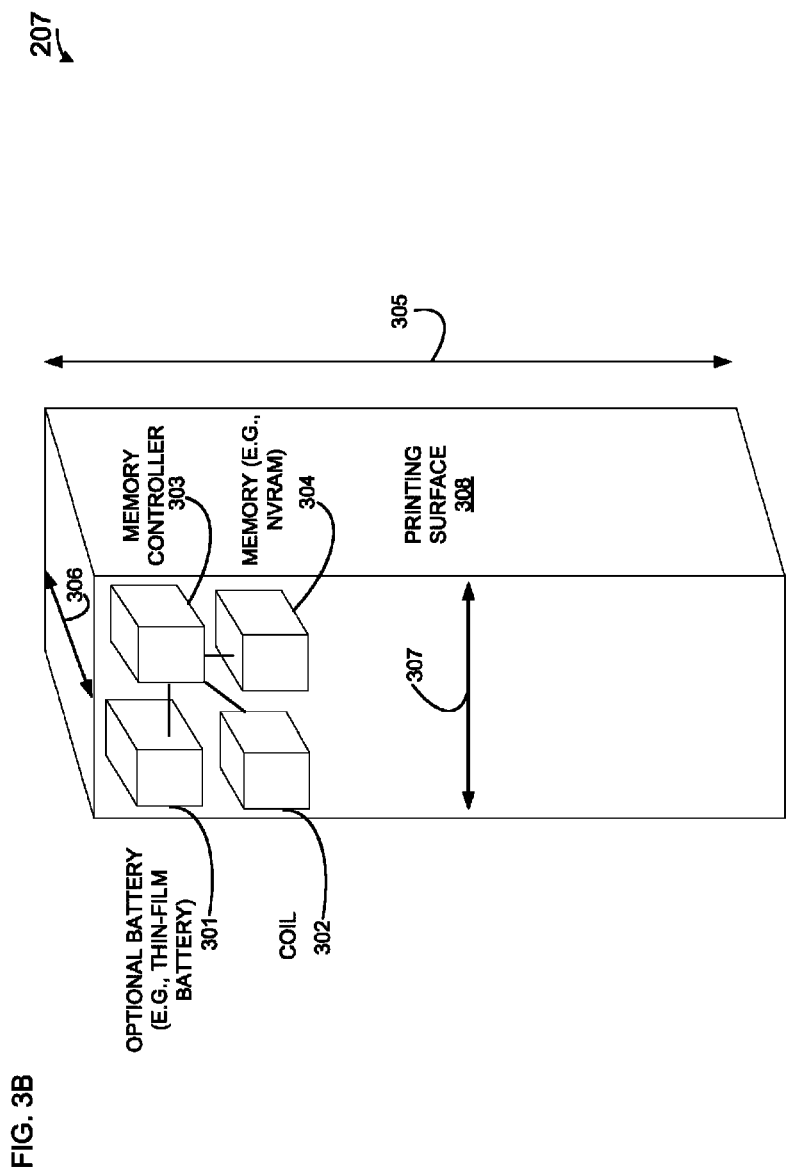

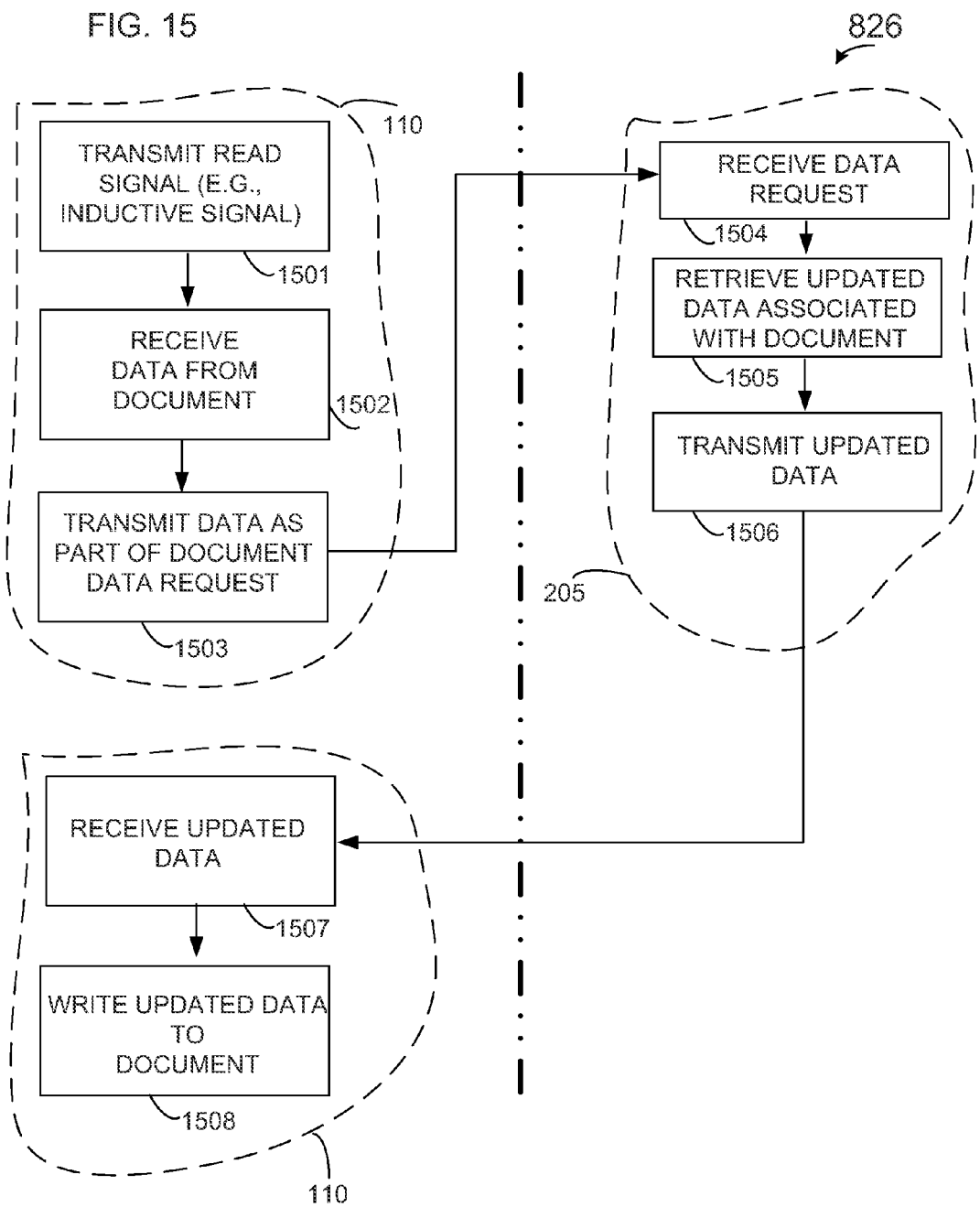

DOCUMENT WITH INDUCTIVE CHARGING AND DATA STORAGE AND TRANSMISSION

CROSS REFERENCE TO RELATED APPLICATIONS

This application is related to U.S. patent application Ser. No. 12/478,766, filed Jun. 4, 2009, entitled INDUCTIVE SIGNAL TRANSFER SYSTEM FOR COMPUTING DEVICES; which is a continuation-in-part of U.S. patent application Ser. No. 12/239,656, filed Sep. 26, 2808, entitled ORIENTATION AND PRESENCE DETECTION FOR USE IN CONFIGURING OPERATIONS OF COMPUTING DEVICES IN DOCKED ENVIRONMENTS, which claims benefit of priority to the following applications: Provisional U.S. Patent Application No. 61/142,560, filed Jan. 5, 2009, entitled ELECTRICAL APPARATUS FOR REAL TIME WIRELESS POWER DELIVERY; Provisional U.S. Patent Application No. 61/142,194, filed Dec. 31, 2808, entitled PROTOCOL FOR REAL TIME POWER AND ACCESSORY DATA CONNECTION; Provisional U.S. Patent Application No. 61/142,195, filed Jan. 1, 2009, entitled TECHNIQUES FOR MAGNETICALLY COUPLING CHARGING CIRCUITS AND DEVICES; Provisional U.S. Patent Application No. 61/142,602, filed Jan. 5, 2009, entitled MAGNETIC CLASP WITH MULTIPLE ORIENTATIONS AND ORIENTATION DETECTION; all of the aforementioned priority applications being hereby incorporated by reference in their entirety.

BACKGROUND

Data can be embedded in paper using any number of methods and formats associated with these method. One example is a barcode which is an optical machine-readable representation of data, which shows data about the object to which it attaches. Originally, barcodes represented data by varying the widths and spacings of parallel lines, and may be referred to as linear or 1 dimensional (1D). Later they evolved into rectangles, dots, hexagons and other geometric patterns in 2 dimensions (2D). Although 2D systems use a variety of symbols, they are generally referred to as barcodes as well. Barcodes originally were scanned by special-optical scanners called barcode readers, scanners and interpretive software are available on devices including desktop printers and smartphones.

BRIEF DESCRIPTION OF THE DRAWINGS

Some embodiments of the invention are described, by way of example, with respect to the following figures:

FIG. 1A illustrates one embodiment of a mobile computing device, according to an example embodiment, that is used to retrieve data from a document using inductive power, and to display an updated version of the document on a screen or in printed form.

FIG. 1B illustrates one embodiment of a mobile computing device, according to an example embodiment, that is used to retrieve data from a document using inductive power, and to display an updated version of the document on a screen or in printed form.

FIG. 3B is a side view of a document, according to an example embodiment, from which data is read using active RFID powered via induction.

FIG. 15 is a dual-stream flow chart illustrating a method, according to an example embodiment, implementing a write logic module to retrieve data from a document using electrical power received via induction, and to store updated data to memory embedded in the document.

DETAILED DESCRIPTION

Figure 2:
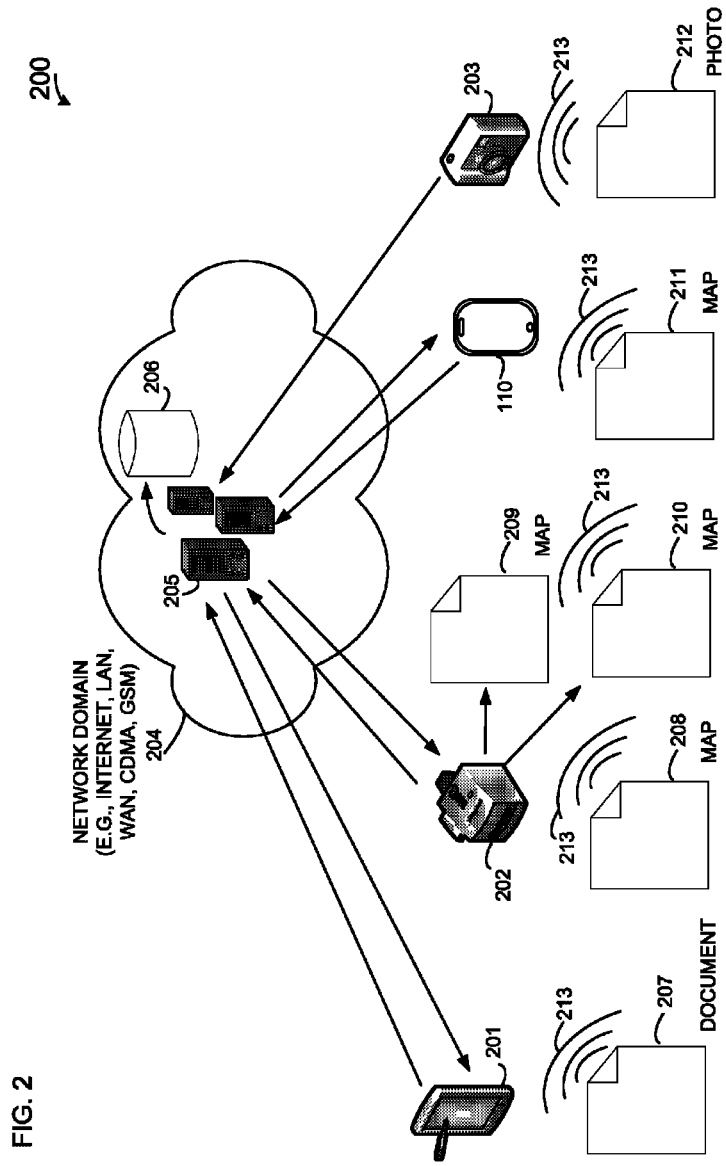
FIG. 2 is a system, according to an example embodiment, used to retrieve data from a document using electrical power received via induction, and to display an updated version of the document on a screen or in printed form.

Illustrated is a system and method to retrieve data from a document using electrical power received via induction, and to display an updated version of the document on a screen or in printed form. Data, as used herein, may be binary encoded, use some other suitable format. A document, as used herein, may be a sheet of material (e.g., paper) upon which a text or an image may be written. For example, the document may be 20.32 cm wide, 27.94 cm long, and have a thickness (caliper) of between 50.8 microns to 2.8 millimeters. Inductive charging is described in U.S. Pat. No. 7,065,658 titled "Method and apparatus for synchronizing and recharging a connector-less portable computer system" which is incorporated by reference in its entirety. Induction is further referenced herein as physical interaction.

In one example embodiment, the document has a coil, an optional battery, and Non-Volatile Random Access Memory (NVRAM) embedded in it, where the coil received electrical power via induction, and the electrical power is used to read data from or write data to the NVRAM. The coil may be formed from some suitable material (e.g., copper, gold) and may have dimensions less than the length, width and thickness of the document. The optional battery may be a thin-film battery of the type that is described in U.S. Pat. No. 7,194,801 titled "Thin-film battery having ultra-thin electrolyte and associated method" which is incorporated by reference in its entirety. The reading of writing of data can occur wirelessly using active Radio Frequency Identification (RFID). Active RFID is described in U.S. Pat. No. 7,683,761 titled "Method for Autonomous Establishment and Utilization of an Active RF Tag Network" which is incorporated by reference in its entirety. The data may describe the document itself or the text or image printed to the document. Example data includes metadata, security information (e.g., a public or private key common to an asymmetric or symmetric encryption regime), a Globally Unique Identifier (GUID) value, or some other suitable data. Additionally, the data may include Uniform Resource Location (URL) data (e.g., a hyperlink), photo data (e.g., Joint Photographic Experts Group (JPEG) formatted data), metadata (e.g., Hyper-Text Markup Language (HTML), or eXtensible Markup Language (XML) formatted data), comma-delimited data, or some other suitable type of data.

In one example embodiment, the NVRAM contains a GUID to identify a document and that is used to facilitate the providing of an updated version of the document. This GUID may be retrieved from the document as data by a mobile computing device using induction and RFID. In another example embodiment, the GUID may be retrieved from the document as data by a printer using induction and RFID. Once retrieved, the GUID is used to retrieve a current version of the document, the current version retrieved by a mobile computing device or printer from a server. The current version of the document may be an updated map. This updated map may be displayed on the screen of the mobile computing device. Alternatively, this updated map may be printed by the printer.

In one example embodiment, the NVRAM contains a private key that uniquely identifies the document. This private key may be retrieved from the document as data by a mobile computing device using induction and RFID. Once retrieved, the private key is then used to verify the authenticity of the document. Verification can take the form of the mobile computing device transmitting the private key as data to a server, and the server perform a verification of the private key and transmitting the results (e.g., the private key is valid or invalid) back to the mobile computing device.

In some example embodiments, using security information or a GUID retrieved from the document, data is provided to a server. This data may be provided by a form factor that includes at least one of a mobile computing device, or a printer. Based upon the data, the server may provide the form factor updated data for the document. This updated data is written to the NVRAM of the document using induction and active RFID. This data may include URL data (e.g., a hyperlink), photo data (e.g., JPEG formatted data), metadata (e.g., HTML, or XML formatted data), comma-delimited data, or some other suitable type of data.

FIGS. 1A and 1B illustrate one embodiment of a mobile computing device 110 that is used to retrieve data from a document using inductive power, and to display an updated version of the document on a screen or in printed form. FIG. 1A illustrates one embodiment of a first positional state of the mobile computing device 110 having telephonic functionality, e.g., a mobile phone or smartphone. FIG. 1B illustrates one embodiment of a second positional state of the mobile computing device 110 having telephonic functionality, e.g., a mobile phone, slate device, smartphone, netbook, or laptop computer. The mobile computing device 110 is configured to host and execute a phone application for placing and receiving telephone calls. In one example embodiment, the configuration as disclosed may be configured for use between a mobile computing device, that may be host device, and an accessory device.

It is noted that for ease of understanding the principles disclosed herein are in an example context of a mobile computing device 110 with telephonic functionality operating in a mobile telecommunications network. However, the principles disclosed herein may be applied in other duplex (or multiplex) telephonic contexts such as devices with telephonic functionality configured to directly interface with Public Switched Telephone Networks (PSTN) and/or data networks having Voice over Internet Protocol (VoIP) functionality. Likewise, the mobile computing device 110 is only by way of example, and the principles of its functionality apply to other computing devices, e.g., desktop computers, slate devices, server computers and the like.

The mobile computing device 110 includes a first portion 110a and a second portion 110b. The first portion 110a comprises a screen for display of information (or data) and may include navigational mechanisms. These aspects of the first portion 110a are further described below. The second portion 110b comprises a keyboard and also is further described below. The first positional state of the mobile computing device 110 may be referred to as an "open" position, in which the first portion 110a of the mobile computing device slides in a first direction exposing the second portion 110b of the mobile computing device 110 (or vice versa in terms of movement). The mobile computing device 110 remains operational in either the first positional state or the second positional state.

The mobile computing device 110 is configured to be of a form factor that is convenient to hold in a user's hand, for example, a Personal Digital Assistant (PDA) or a smart phone form factor. For example, the mobile computing device 110 can have dimensions ranging from 7.5 to 15.5 centimeters in length, 5 to 15 centimeters in width, 0.5 to 2.5 centimeters in thickness and weigh between 50 and 250 grams.

The mobile computing device 110 includes a speaker 120, a screen 130, and an optional navigation area 140 as shown in the first positional state. The mobile computing device 110 also includes a keypad 150, which is exposed in the second positional state. The mobile computing device also includes a microphone (not shown). The mobile computing device 110 also may include one or more switches (not shown). The one or more switches may be buttons, sliders, or rocker switches and can be mechanical or solid state (e.g., touch sensitive solid state switch).

The screen 130 of the mobile computing device 110 is, for example, a 240×240, a 320×320, a 320×480, or a 640×480 touch sensitive (including gestures) display screen. The screen 130 can be structured from, for example, such as glass, plastic, thin-film or composite material. In one embodiment the screen may be 1.5 inches to 5.5 inches (or 4 centimeters to 14 centimeters) diagonally. The touch sensitive screen may be a transflective liquid crystal display (LCD) screen. In alternative embodiments, the aspect ratios and resolution may be different without departing from the principles of the inventive features disclosed within the description. By way of example, embodiments of the screen 130 comprises an active matrix liquid crystal display (AMLCD), a thin-film transistor liquid crystal display (TFT-LCD), an organic light emitting diode (OLED), an Active-matrix OLED (AMOLED), an interferometric modulator display (IMOD), a liquid crystal display (LCD), or other suitable display device. In an embodiment, the display displays color images. In another embodiment, the screen 130 further comprises a touch-sensitive display (e.g., pressure-sensitive (resistive), electrically sensitive (capacitive), acoustically sensitive (SAW or surface acoustic wave), photo-sensitive (infra-red)) including a digitizer for receiving input data, commands or information from a user. The user may use a stylus, a finger or another suitable input device for data entry, such as selecting from a menu or entering text data.

The optional navigation area 140 is configured to control functions of an application executing in the mobile computing device 110 and visible through the screen 130. For example, the navigation area includes an x-way (x is a numerical integer, e.g., 5) navigation ring that provides cursor control, selection, and similar functionality. In addition, the navigation area may include selection buttons to select functions displayed through a user interface on the screen 130. In addition, the navigation area also may include dedicated function buttons for functions such as, for example, a calendar, a web browser, an e-mail client or a home screen. In this example, the navigation ring may be implemented through mechanical, solid state switches, dials, or a combination thereof. In an alternate embodiment, the navigation area 140 may be configured as a dedicated gesture area, which allows for gesture interaction and control of functions and operations shown through a user interface displayed on the screen 130. In some example embodiments, a camera 141 with infrared reading capabilities is also shown.

The keypad area 150 may be a numeric keypad (e.g., a dialpad) or a numeric keypad integrated with an alpha or alphanumeric keypad or character keypad 150 (e.g., a keyboard with consecutive keys of Q-W-E-R-T-Y, A-Z-E-R-T-Y, or other equivalent set of keys on a keyboard such as a DVORAK keyboard or a double-byte character keyboard).

Although not illustrated, it is noted that the mobile computing device 110 also may include an expansion slot. The expansion slot is configured to receive and support expansion cards (or media cards). Examples of memory or media card form factors include COMPACT FLASH, SD CARD, XD CARD, MEMORY STICK, MULTIMEDIA CARD, SDIO, and the like.

FIG. 2 is an example system 200 used to retrieve data from a document using electrical power received via induction, and to display an updated version of the document on a screen or in printed form. Shown is a tablet device 201 operatively connected to a network domain 204. Operatively connected includes a physical or logical connection. As shown at 213, a physical interaction occurs between a document 207 and the tablet device 201. Where this physical interaction occurs, data is read from NVRAM residing on the document 207, where the power for this read operation is provided via induction. The tablet device 201 reads the data using active RFID. In some example embodiments, a protocol is used in conjunction or in lieu of active RFID. These protocols may include Worldwide Interoperability for Microwave Access (WiMax), Institute of Electrical and Electronics Engineers (IEEE) 802.11, IEEE 802.16, IEEE 802.15, or IEEE 802.20. Once read, the data is transmitted by the tablet device 201 via the network domain 204 to at least one server 204 that included a database 206. The data in the database 206 includes metadata, security information (e.g., a public or private key common to an asymmetric or symmetric encryption regime), a Globally Unique Identifier (GUID) value, or some other suitable data. In one example embodiment, the data includes a private key that is used to authenticate the document using the at least one server 204 via the network domain 204. Where the private key is verified by the at least one server 204, the tablet device 201 receives an authentication prompt (e.g., a Boolean value transmitted over the network domain 204) from the at least one server 205 authenticating the document 207.

In some example embodiments, a printer 202 is operatively connected to the network domain 204 and is used to retrieve data from a document using electrical power received via induction, and to print an updated version of the document. As shown at 213, a physical interaction occurs between the printer 202 and the map 208. Data is retrieved from the map 208, and uploaded to the at least one server 205. Retrieval may take the form of active RFID powered via induction. This data may be a GUID. Based upon the GUID, a map 209 is provided by the at least one server 205 to the printer 202 using the network domain 204. This map 209 may be an updated version of the map 208. An updated document may be printed in lieu of the map 209 using the method illustrated herein.

In some example embodiments, a printer 202 is used to retrieve data from a map 210 using electrical power received via induction, and to print the map 210 based upon the data. As shown at 213, a physical interaction occurs between the printer 202 and the map 210. Data is retrieved from the map 210 using active RFID powered via induction. The map 210 is printed by the printer 202 using the data. A document may be printed in lieu of the map 210 using the method illustrated herein.

In some example embodiments, the mobile computing device 110 is used to retrieve data from a map 211 so as to retrieve an updated version of the map 211. As shown at 213, a physical interaction occurs between a map 211 and the mobile computing device 110. Where this physical interaction occurs, data is read from NVRAM residing on the map 211, where the power for this read operation is provided via induction. The mobile computing device 110 reads the data using active RFID. Once read, the data is transmitted by the mobile computing device 110 via the network domain 204 to at least one server 204 that included a database 206. In one example embodiment, the data includes a GUID that is used to identify the map 211 using the at least one server 204 via the network domain 204. Where the map 211 is identified by the at least one server 204, the mobile computing device 110 receives an updated version of the map 211. This updated version may be displayed on the mobile computing device 110.

In some example embodiments, a camera 203 is used to retrieve data from a photo 212 so as to upload the data to the at least one server 205. As shown at 213, a physical interaction occurs between a photo 212 and the camera 203. Where this physical interaction occurs, data is read from NVRAM residing on the photo 212, where the power for this read operation is provided via induction. The camera 203 reads the data using active RFID. Once read, the data is transmitted by the camera 203 via the network domain 204 to at least one server 204 that included a database 206. In one example embodiment, the data includes metadata describing the photo 212, and a GUID used to uniquely identify the photo 212. The metadata may include HTML or XML formatted data describing the place where the photo 212 was taken, the author of the photo 212, the date and time at which the photo 212 was taken or other suitable information.

Figure 3A:
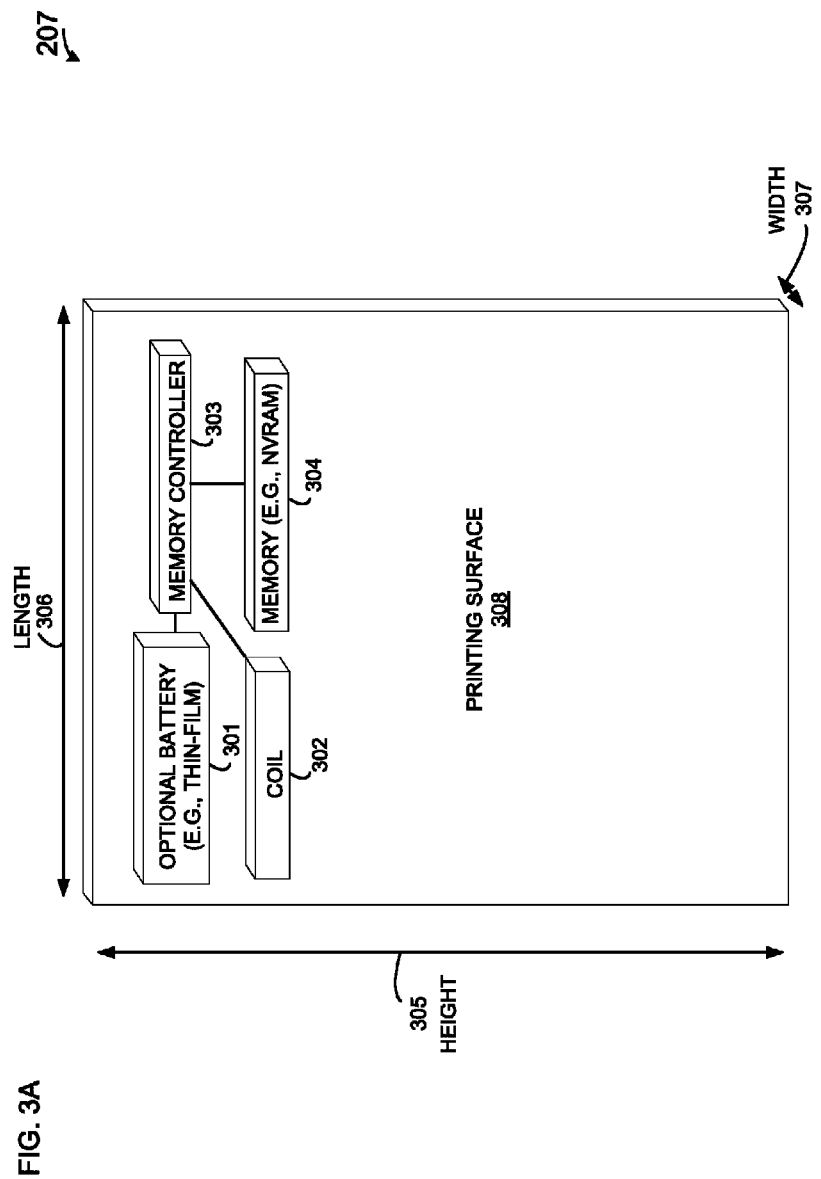
FIG. 3A is a front view of a document, according to an example embodiment, from which data is read using active RFID powered via induction.

FIG. 3A is a front view of an example document 207 from which data is read using active RFID powered via induction. This document has a height 305, length 306, and a width 307. For example, the document 207 may be 27.94 cm high, 20.32 cm long, and have a thickness or width of between 50.8 microns to 2.8 millimeters. Embedded within the document 207 may be an optional thin-film battery 301, coil 302, memory controller 303 and memory 304. Various buses maybe used to physically connect the optional thin-film battery 301, coil 302, memory controller 303 and memory 304. The coil 302 may also include an RF transceiver capable of active RF. A printing surface 308 is also shown upon which text, graphics, illustrations, or other data may be printed.

FIG. 3B is a side view of an example document 207 from which data is read using active RFID powered via induction. Illustrated as embedded in the document 207 are the optional thin-film battery 301, coil 302, memory controller 303 and memory 304. The height, length and width of the document 207 are merely illustrative. Further, the optional thin-film battery 301, coil 302, memory controller 303 and memory 304 may also be embedded in the maps 208-211, or the photo 212.

Figure 4:
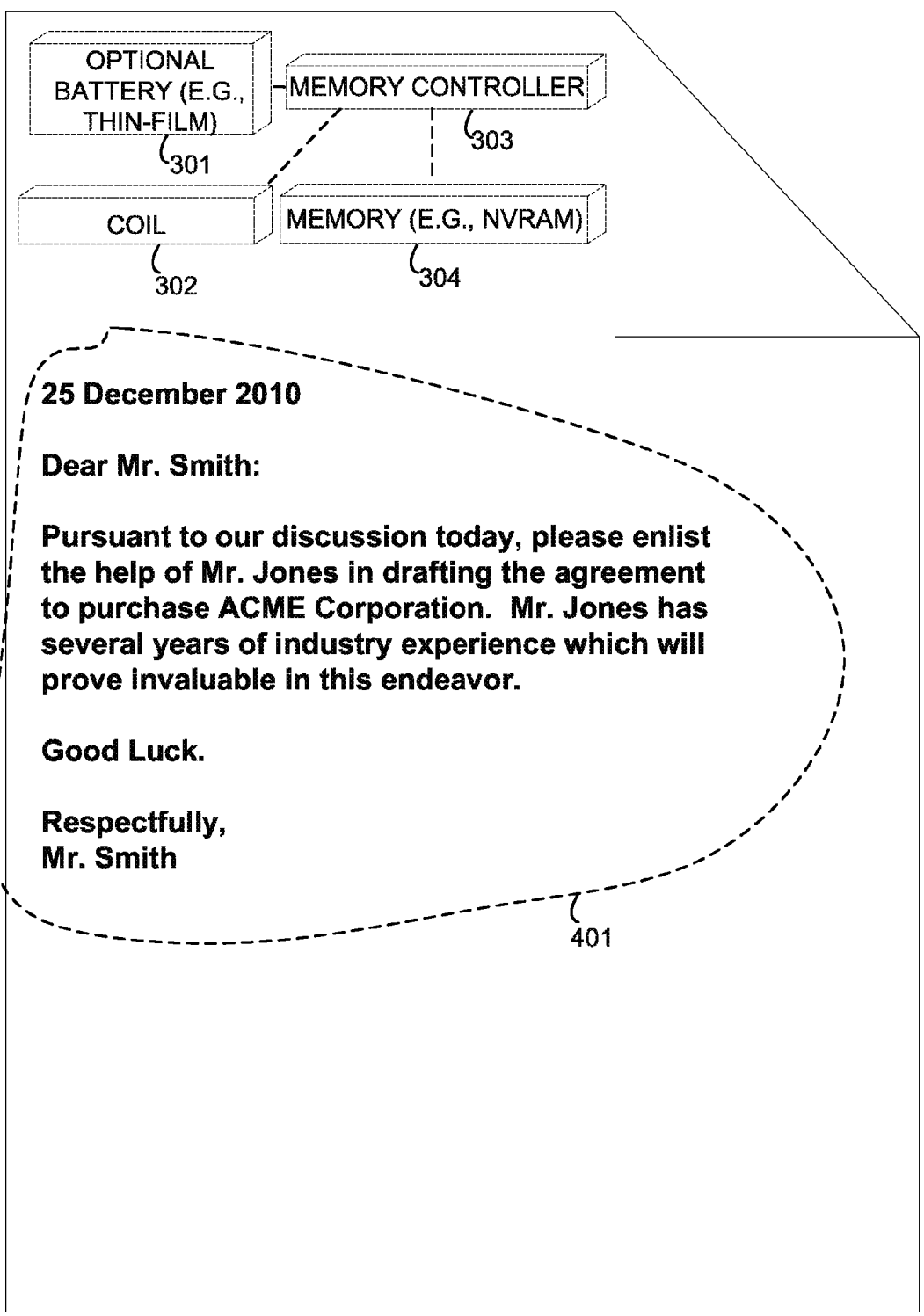
FIG. 4 is a diagram of a document, according to an example embodiment, with text written to the surface of the document.

FIG. 4 is a diagram of an example document 207 with text written to the surface of the document 207. Shown is the document 207 with embedded optional thin-film battery 301, coil 302, memory controller 303 and memory 304. Also shown as part of this document 207, is text 401. As shown above, this document 207 may be authenticated using a symmetric or asymmetric key stored in the memory 304. In some example embodiments, a hash of the text 401 is generated and stored in the memory 304. This hash is retrieved by a form factor such as the mobile computing device 110 or tablet device 201, and transmitted to the at least one server 205 for authentication.

Figure 5:
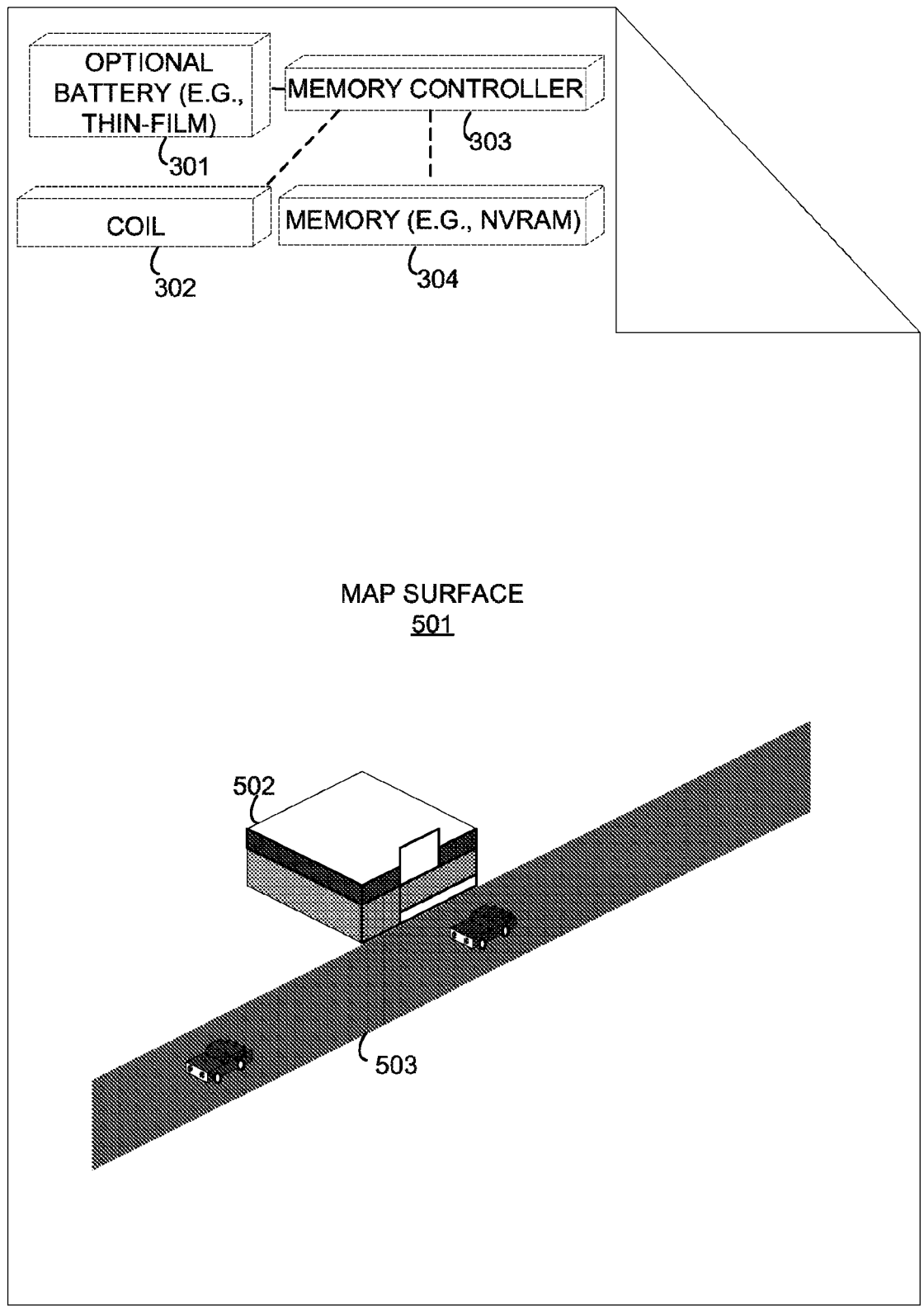
FIG. 5 is a diagram of a map, according to an example embodiment, with map points illustrating the surface of the map.

FIG. 5 is a diagram of an example map 208 with map points illustrating the surface of the map 208. Shown is a map surface 501 with map points 502 and 503 illustrating the surface of the map 208. Embedded in the map 208 is an optional thin-film battery 301, coil 302, memory controller 303 and memory 304. As shown above, this map 208 may be identified via a GUID that is retrieved by a form factor such as a mobile computing device 110 or printer 202. This GUID is retrieved from the memory 304 via inductively powering the memory 304 using a coil 302. Once identified, an updated map may be provided for display or printing.

Figure 6:
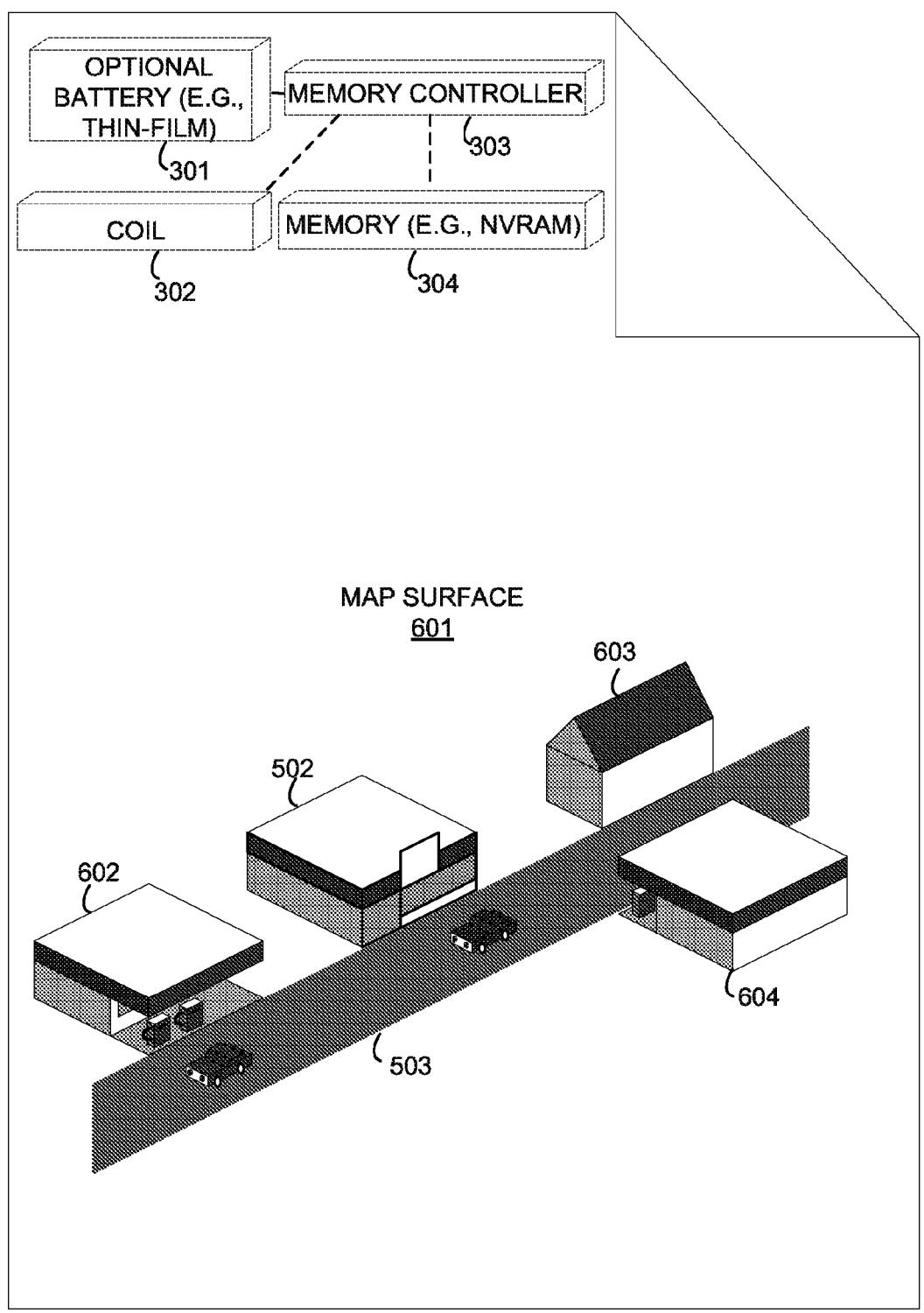
FIG. 6 is a diagram of a map, according to an example embodiment, with updated map points illustrating the surface of the map.

FIG. 6 is a diagram of an example map 209 with updated map points illustrating the surface of the map 209. Shown is a map surface 601. Optionally embedded in the map 209 is an optional thin-film battery 301, coil 302, memory controller 303 and memory 304. Illustrating the map surface 601 are the map points 502 and 503 shown in FIG. 5. Additionally shown are map points 602, 603, and 604 that serve to update the map 208. In some example embodiments, these map points 602, 603, and 604 are written to the memory 304 by the mobile computing device 110, tablet device 201, or printer 202.

Figure 7:
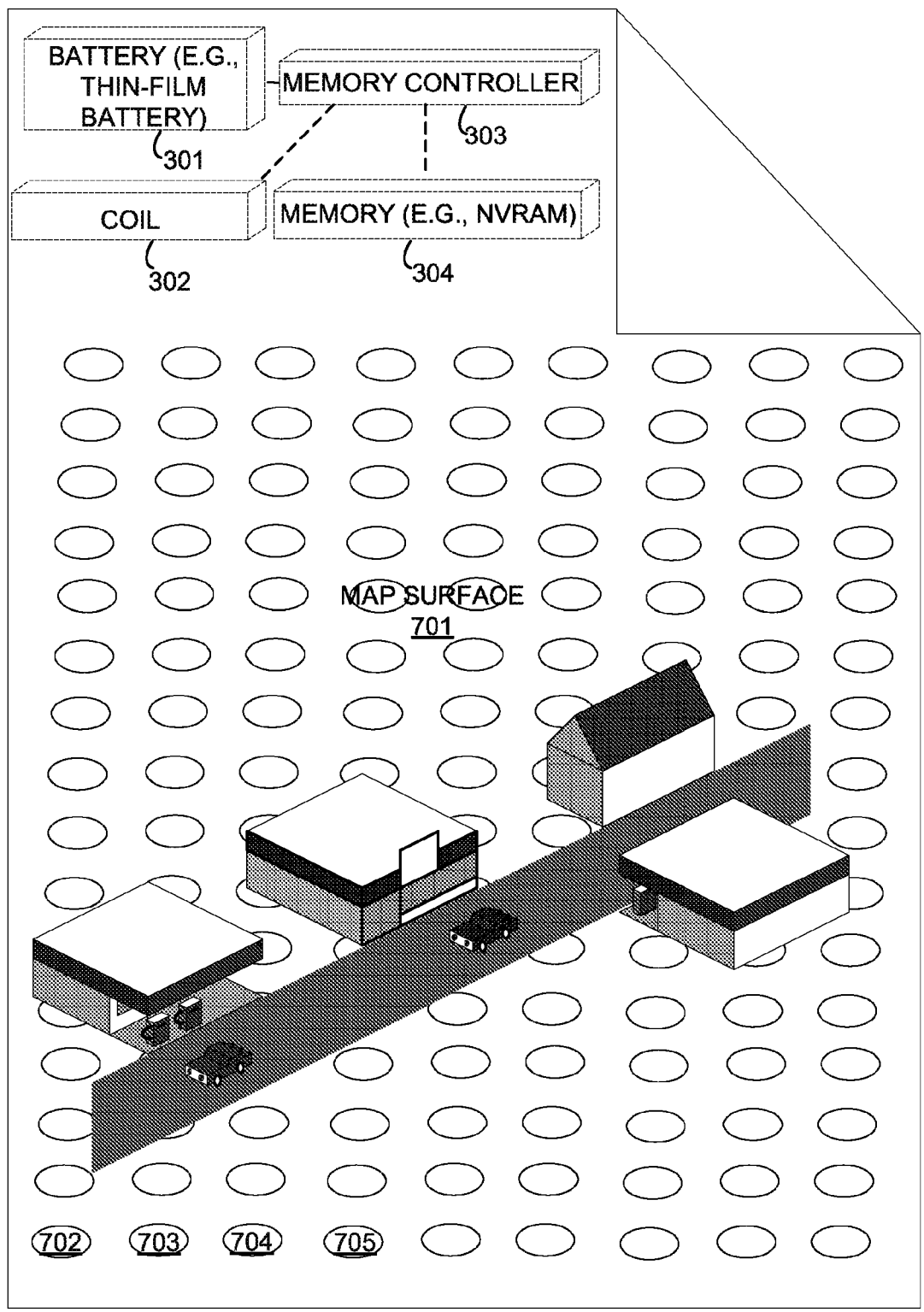
FIG. 7 is a diagram of a map, according to an example embodiment, that includes optical machine-readable representation of data.

FIG. 7 is a diagram of an example map 210 that includes optical machine-readable representation of data. Shown is a map surface 701. Embedded in the map 209 is an optional thin-film battery 301, coil 302, memory controller 303 and memory 304. Appearing on the map surface 701 is optical machine-readable representation of data 702-705. This optical machine-readable representation of data 702-705 may be of varying geometric pattern (e.g., a barcode) and be infra-red (IR) detectable and used to encode data otherwise stored in the memory 304.

Figure 8:
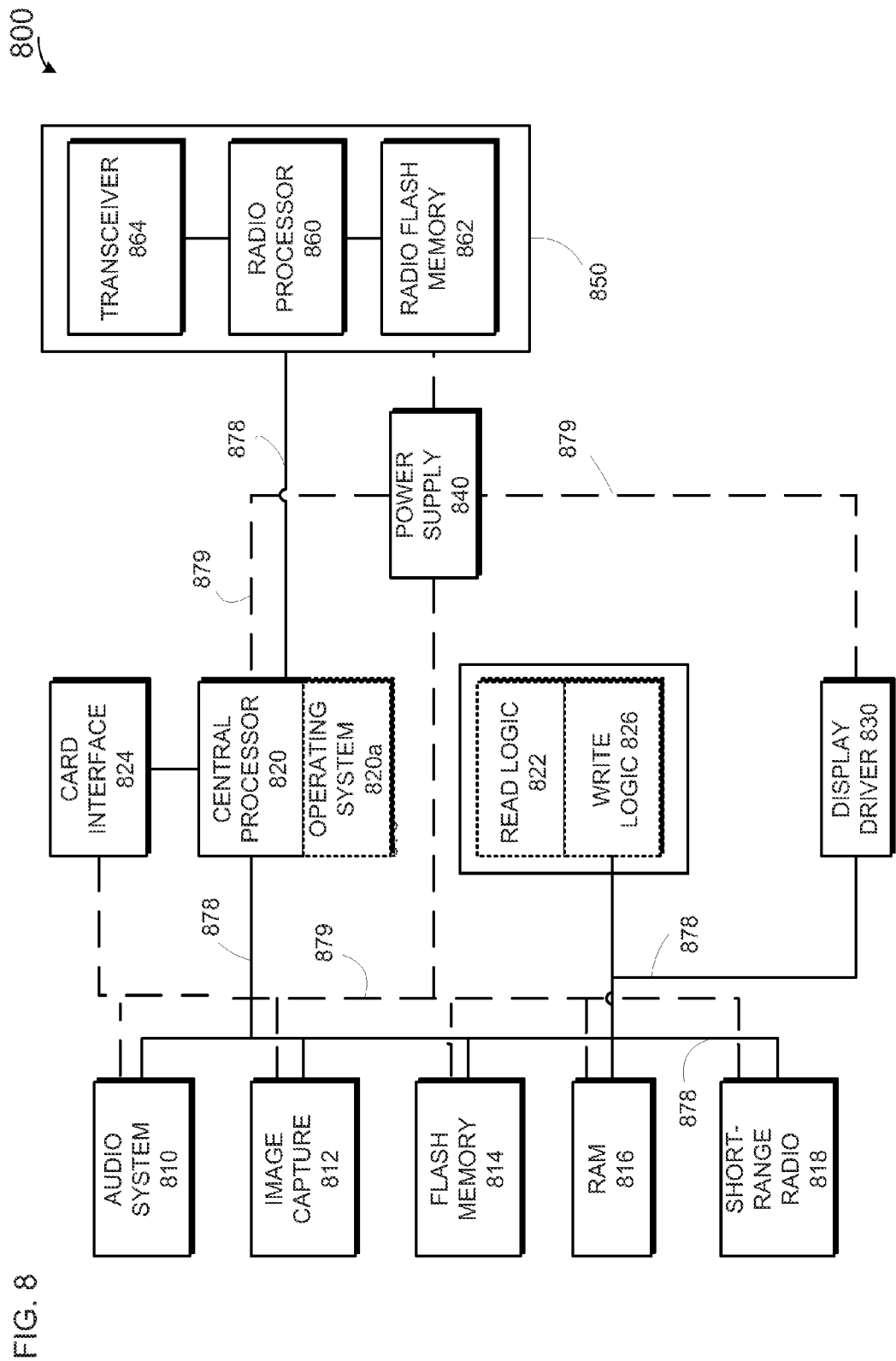
FIG. 8 is a block diagram illustrates an architecture, according to an example embodiment, of a mobile computing device, enabled to retrieve data from a document, and to display an updated version of the document on a screen or in printed form.

Referring next to FIG. 8, a block diagram illustrates an example architecture of a mobile computing device 110, enabled to retrieve data from a document, and to display an updated version of the document on a screen 130 or in printed form. By way of example, the architecture illustrated in FIG. 8 will be described with respect to the mobile computing device of FIGS. 1a, 1b, or the tablet 201, printer 202, or camera 203. The mobile computing device 110 includes a central processor 820, a power supply 840, and a radio subsystem 850. Examples of a central processor 820 include processing chips and system based on architectures such as ARM (including cores made by microprocessor manufacturers), ARM XSCALE, QUALCOMM SNAPDRAGON, AMD ATHLON, SEMPRON or PHENOM, INTEL ATOM, XSCALE, CELERON, CORE, PENTIUM or ITANIUM, IBM CELL, POWER ARCHITECTURE, SUN SPARC and the like.

The central processor 820 is configured for operation with a computer operating system 820a. The operating system 820a is an interface between hardware and an application, with which a user typically interfaces. The operating system 820a is responsible for the management and coordination of activities and the sharing of resources of the mobile computing device 110. The operating system 820a provides a host environment for applications that are run on the mobile computing device 110. As a host, one of the purposes of an operating system is to handle the details of the operation of the mobile computing device 110. Examples of an operating system include PALM OS and WEBOS, MICROSOFT WINDOWS (including WINDOWS 7, WINDOWS CE, and WINDOWS MOBILE), SYMBIAN OS, RIM BLACKBERRY OS, APPLE OS (including MAC OS and IPHONE OS), GOOGLE ANDROID, and LINUX.

The central processor 820 communicates with an audio system 810, an image capture subsystem (e.g., camera, video or scanner) 812, flash memory 814, RAM memory 816, and a short range radio module 818 (e.g., Bluetooth, Wireless Fidelity (WiFi) component (e.g., IEEE 802.11, 802.20, 802.15, 802.16)). The central processor 820 communicatively couples these various components or modules through a data line (or bus) 878. The power supply 840 powers the central processor 820, the radio subsystem 850 and a display driver 830 (which may be contact- or inductive-sensitive). The power supply 840 may correspond to a direct current source (e.g., a battery pack, including rechargeable) or an alternating current (AC) source. The power supply 840 powers the various components through a power line (or bus) 879.

The central processor communicates with applications executing within the mobile computing device 110 through the operating system 820a. In addition, intermediary components, for example, a read logic module 822 and a write logic module 826, provide additional communication channels between the central processor 820 and operating system 820 and system components, for example, the display driver 830.

It is noted that in one embodiment, central processor 820 executes logic (e.g., by way of programming, code, or instructions) corresponding to executing applications interfaced through, for example, the navigation area 140 or switches. It is noted that numerous other components and variations are possible to the hardware architecture of the computing device 800, thus an embodiment such as shown by FIG. 8 is just illustrative of one implementation for an embodiment.

In one example embodiment, a read logic module 826 is shown that is software (e.g., integrated with the operating system) or firmware (lower level code that resides is a specific memory for that code and for interfacing with specific hardware, e.g., the processor 820). The read logic module 826 is configured to read data from the NVRAM embedded in the document 207.

In one example embodiment, a write logic module 828 is shown that is software (e.g., integrated with the operating system) or firmware (lower level code that resides is a specific memory for that code and for interfacing with specific hardware, e.g., the processor 820). This write logic module 828 is executed to write data to the NVRAM of the document 207.

The radio subsystem 850 includes a radio processor 860, a radio memory 862, and a transceiver 864. The transceiver 864 may be two separate components for transmitting and receiving signals or a single component for both transmitting and receiving signals. In either instance, it is referenced as a transceiver 864. The receiver portion of the transceiver 864 communicatively couples with a radio signal input of the device 110, e.g., an antenna, where communication signals are received from an established call (e.g., a connected or on-going call). The received communication signals include voice (or other sound signals) received from the call and processed by the radio processor 860 for output through the speaker 120. The transmitter portion of the transceiver 864 communicatively couples a radio signal output of the device 110, e.g., the antenna, where communication signals are transmitted to an established (e.g., a connected (or coupled) or active) call. The communication signals for transmission include voice, e.g., received through the microphone of the device 110, (or other sound signals) that is processed by the radio processor 860 for transmission through the transmitter of the transceiver 864 to the established call.

In one embodiment, communications using the described radio communications may be over a voice or data network. Examples of voice networks include Global System of Mobile (GSM) communication system, a Code Division, Multiple Access (CDMA system), and a Universal Mobile Telecommunications System (UMTS). Examples of data networks include General Packet Radio Service (GPRS), third-generation (3G) mobile (or greater), High Speed Download Packet Access (HSDPA), High Speed Uplink Packet Access (HSUPA), and Worldwide Interoperability, for Microwave Access (WiMAX).

While other components may be provided with the radio subsystem 850, the basic components shown provide the ability for the mobile computing device to perform radio-frequency communications, including telephonic communications. In an embodiment, many, if not all, of the components under the control of the central processor 820 are not required by the radio subsystem 850 when a telephone call is established, e.g., connected or ongoing. The radio processor 860 may communicate with central processor 820 using the data line (or bus) 878.

The card interface 824 is adapted to communicate, wirelessly or wired, with external accessories (or peripherals), for example, media cards inserted into the expansion slot (not shown). The card interface 824 transmits data and/or instructions between the central processor and an accessory, e.g., an expansion card or media card, coupled within the expansion slot. The card interface 824 also transmits control signals from the central processor 820 to the expansion slot to configure the accessory. It is noted that the card interface 824 is described with respect to an expansion card or media card; it also may be structurally configured to couple with other types of external devices for the device 110, for example, an inductive charging station for the power supply 840 or a printing device. The power supply 840 may include a primary coil to be used in the inductive charging of a secondary coil 302 that is part of the document 207.

Figure 9:
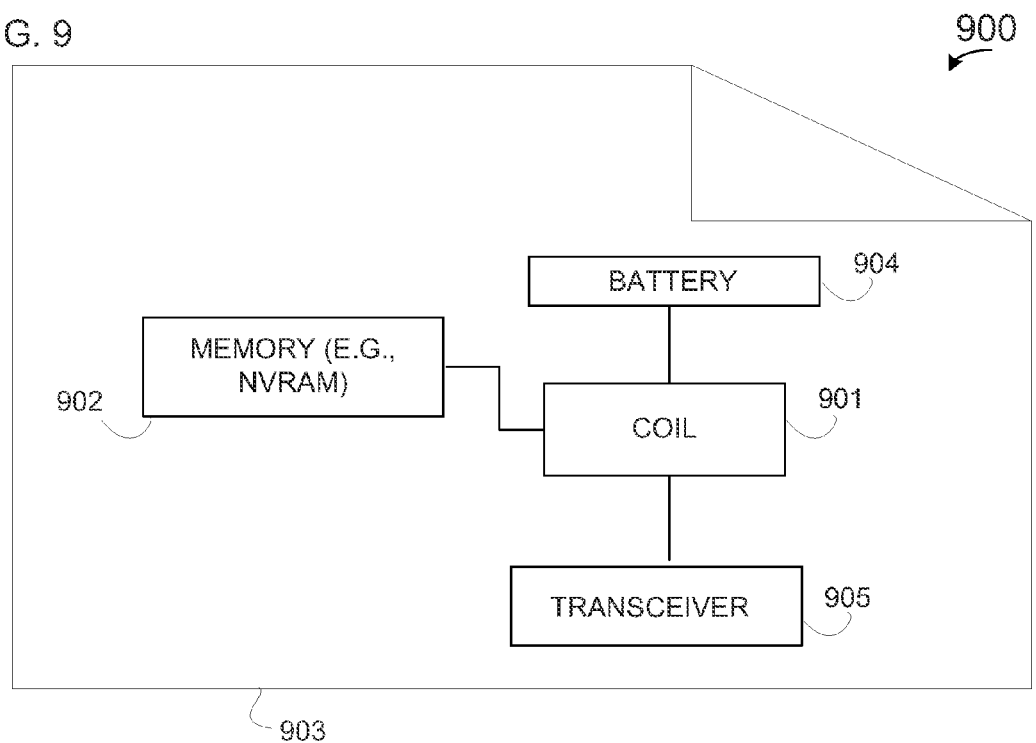
FIG. 9 is a block diagram of an apparatus, according to an example embodiment, that is used to store data relating to a document, data that may be accessed in part using inductively supplied electrical power.

FIG. 9 is a block diagram of an example apparatus 900 that is used to store data relating to a document, data that may be accessed in part using inductively supplied electrical power. The blocks illustrated herein may be implemented in software, hardware or firmware. These blocks may be implemented by the document 207, maps 208-211, of the photo 212. Shown is a coil 901 to inductively receive electrical power, the coil 901 operatively connected to an NVRAM 901. The NVRAM 902 includes data relating to the apparatus, the non-volatile memory supplied with the electrical power. The coil 901 and NVRAM 902 are embedded into a document 903. Operatively connected to the coil 901 is a battery 904 that is charged by the electrical power. Operatively connected to the coil 901 is a transceiver 905 to receive an active RFID request. In some example embodiments, the transceiver receives data to be written to the non-volatile memory. In some example embodiments, the data includes at least one of metadata, a public key, a private key, a hash, a GUID value, a URL, photo data, HTML formatted data, XML formatted data, or comma-delimited data.

Figure 10:
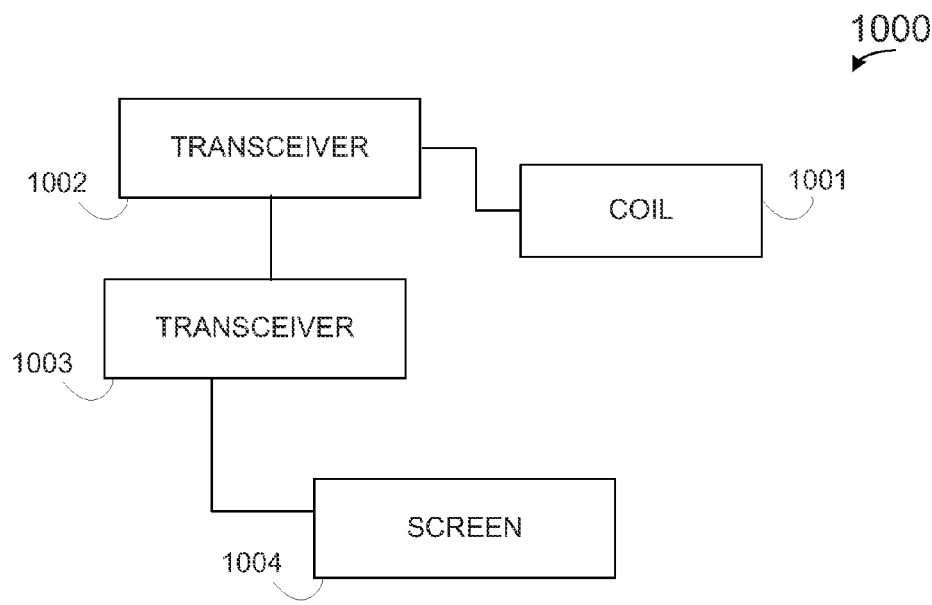
FIG. 10 is a block diagram of a system, according to an example embodiment, to retrieve data from a document using electrical power received via induction, and to display an updated version of the document on a screen or in printed form.

FIG. 10 is a block diagram of an example system 1000 to retrieve data from a document using electrical power received via induction, and to display an updated version of the document on a screen or in printed form. The blocks illustrated herein may be implemented in software, hardware or firmware. These blocks may be implemented by a form factor including the mobile computing device 110, tablet device 201, printer 202, or camera 203. A coil 1001 is illustrated to inductively send electrical power, the electrical power sent to a document that includes an additional coil. Operatively connected to the coil 1001 is a transceiver 1002 to receive data from the document, the document to receive the electrical power via the additional coil and to transmit the data to the computer system using the electrical power. Operatively connected to the transceiver 1002 is an additional transceiver 1003 receive additional data over a network, the additional data relating to the document. In some example embodiments, the transceiver 1002 transmits the additional data to the document, the additional data written to a non-volatile memory embedded in the document. A screen 1004 is operatively connected to the additional transceiver 1003 to display the additional data. In some example embodiments, the data is map data, and the additional data is updated map data. In some example embodiments, the data includes at least one of metadata, a public key, a private key, a hash, a GUID value, a URL, photo data, HTML formatted data, XML formatted data, or comma-delimited data.

Figure 11:
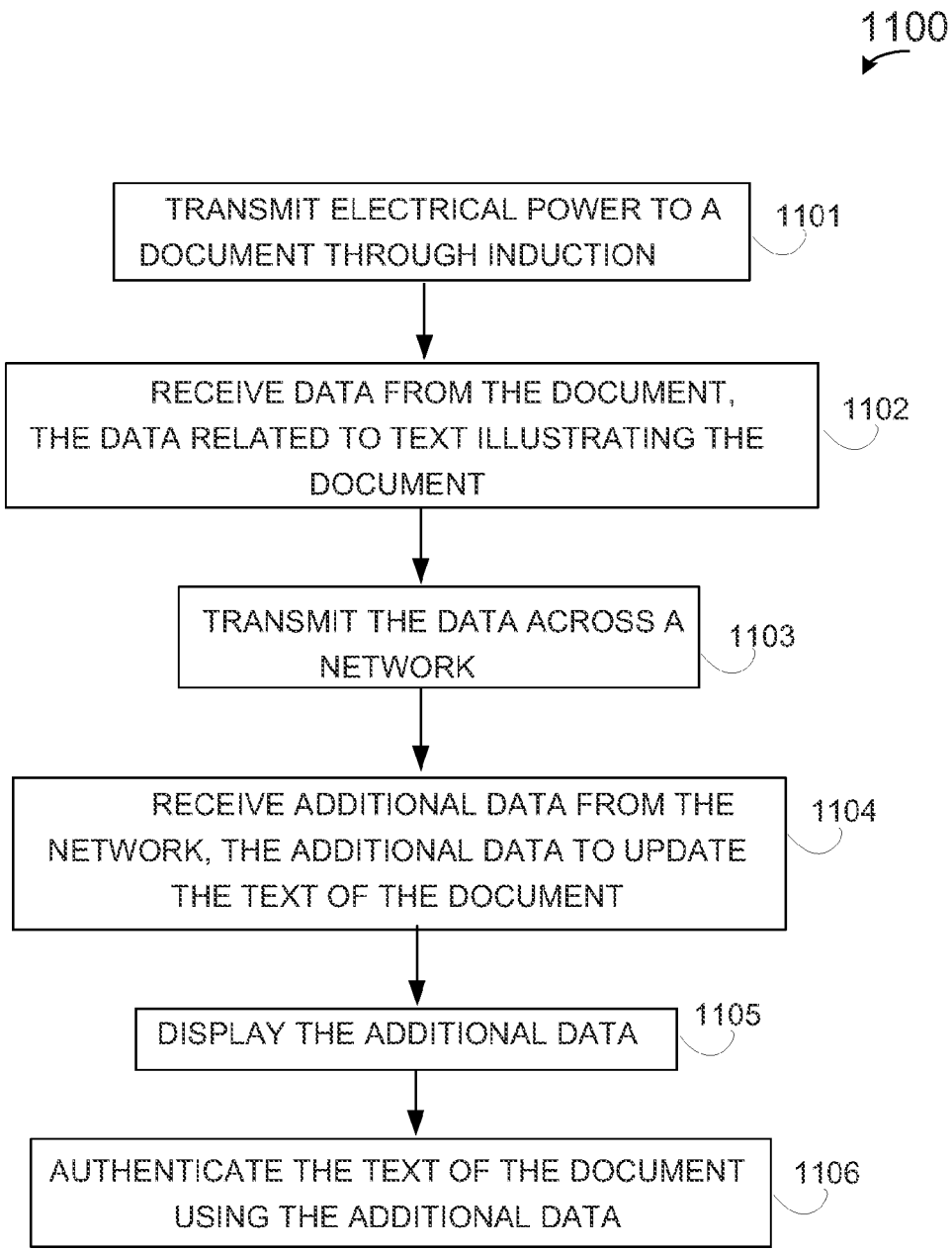
FIG. 11 is a flow chart illustrating a method, according to an example embodiment, to retrieve data from a document using electrical power received via induction, and to display an updated version of the document on a screen or in printed form.

FIG. 11 is a flow chart illustrating an example method 1100 to retrieve data from a document using electrical power received via induction, and to display an updated version of the document on a screen or in printed form. This method 1100 may be implemented by at least one of the mobile computing device 110, tablet device 201, printer 202, or camera 203. Operation 1101 is executed to transmit electrical power to a document through induction. The document may be the document 207. Operation 1102 is executed to receive data from the document, the data related to text illustrating the document. Operation 1103 is executed to transmit the data across a network, such as the network domain 204. Operation 1104 is executed to receive additional data from the network, the additional data to update the text of the document. Operation 1105 is executed to display the additional data. Operation 1106 is executed to authenticate the text of the document using the additional data. In some example embodiments, the additional data includes at least one of a hash, a private key, a GUID, or a public key. In some example embodiments, the data includes the use of active RFID.

Figure 12:
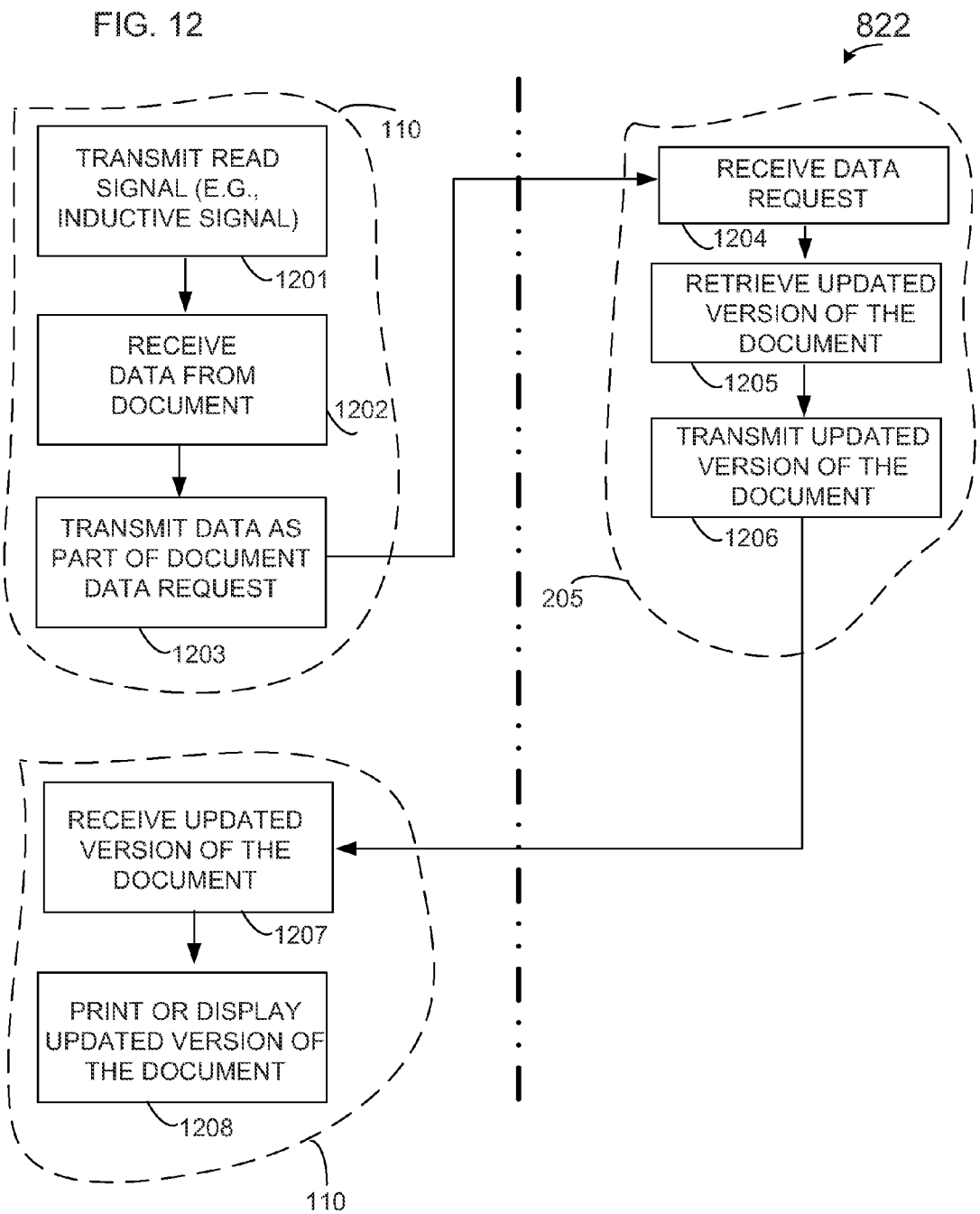
FIG. 12 is a dual-stream flow chart illustrating a method, according to an example embodiment, implementing a read logic module to retrieve data from a document using electrical power received via induction, and to display an updated version of the document on a screen or in printed form.

FIG. 12 is a dual stream flow chart illustrating an example method implementing a read logic module 822 to retrieve data from a document using electrical power received via induction, and to display an updated version of the document on a screen or in printed form. Shown are operations 1201-1203 and 1207-1208 executed by a mobile computing device 110. Also shown are operations 1204-1206 executed by the at least one server 205. Operation 1201 is executed to transmit a read signal. This read signal may be an inductive charge transmitted by a coil residing on the mobile computing device 110. This operation 1201 may be executed where a physical interaction 213 is detected between the mobile computing device 110 and a document 207, maps 208-211, or photo 212. this determination of a physical interaction 213 can be facilitated by bring a primary coil that is part of the form factor (e.g., mobile computing device 110, tablet device 201, printer 202, or camera 203) into proximity to a second coil 302 that part of the document 207, maps 208-211 or photo 212, thus inducing voltage in the second coil. (See generally, U.S. Pat. No. 7,065,658 titled "Method and apparatus for synchronizing and recharging a connector-less portable computer system" which is incorporated by reference in its entirety.) Where voltage is induced, a voltage detector determines that voltage is flowing to the second coil denoting a physical interaction. In some example embodiments, a Hall-effect sensor is used in combination with the second coil 302 to make the determination that a physical interaction 213 has occurred. Operation 1202 is executed to retrieve data from the document 207, maps 208-211 or photo 212. This data may be metadata, security information (e.g., a public or private key common to an asymmetric or symmetric encryption regime), a GUID value, or some other suitable data. The data may be retrieved via active RF utilizing electrical power received via induction, or via an optional battery such as the thin-film battery 301. This optional thin-film battery 301 may be charged via inductive power supplied via the mobile computing device 110 or other suitable form factor. Operation 1203 is executed to transmit the data as part of a document data request. This document data request may be a document retrieval request, or an authentication request provided by the mobile computing device 110, or tablet device 201. Operation 1204 is executed to receive the data request. Operation 1205 is executed to retrieve an updated version of the document from the database 206. In some example embodiments, operation 1205 is executed to authenticate the data that is part of the authentication request. Operation 1206 is executed to transmit the updated version of the document to the requesting device such as the mobile computing device 110, printer 202, tablet device 201, or camera 203. In some example embodiments, operation 1206 is executed to transmit an authentication prompt. Operation 1207 is executed to receive the updated version of the document (e.g., map 209). Operation 1208 is executed to print or display the updated version of the document. In some example embodiments, an authentication prompt is displayed on the screen 130 of a mobile computing device.

Figure 13:
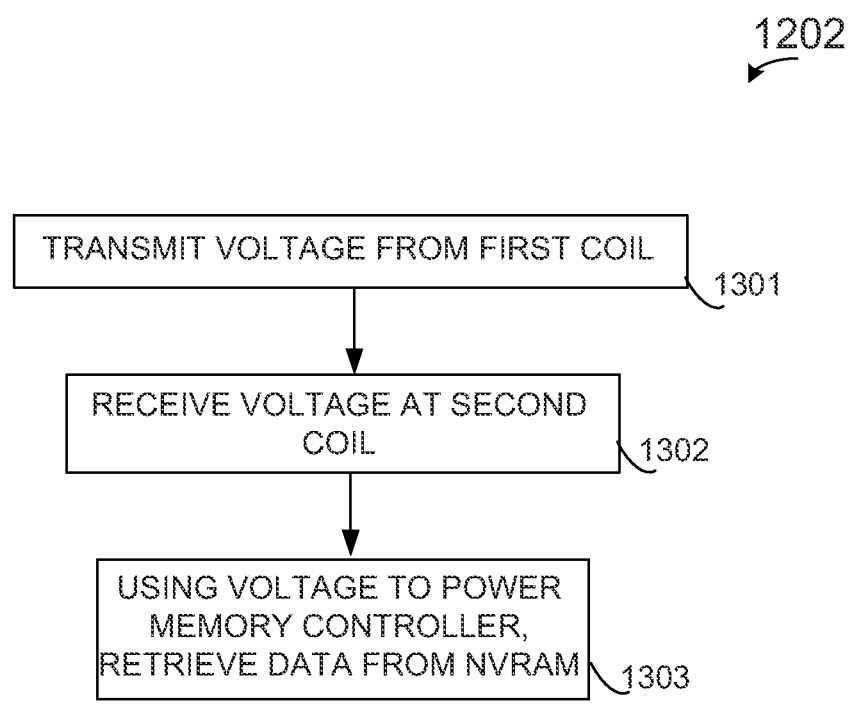
FIG. 13 is a flow chart illustrating the execution of operation, according to an example embodiment, executed to retrieve data from the document, maps, or photo.

FIG. 13 is a flow chart illustrating the execution of operation 1202 executed to retrieve data from the document 207, maps 208-211 or photo 212. Shown is an operation 1301 executed to transmit voltage from a first coil. This first coil may reside on a form factor including at least one of a tablet device 201, printer 202, mobile computing device 110, or camera 203. Operation 1302 is executed to receive voltage at a second coil. The coil 302 is an example of this second coil. Operation 1303 is executed to use this second coil to provide electrical power (voltage) to a memory controller (e.g., a processor) to retrieve the data from the memory 304.

Figure 14:
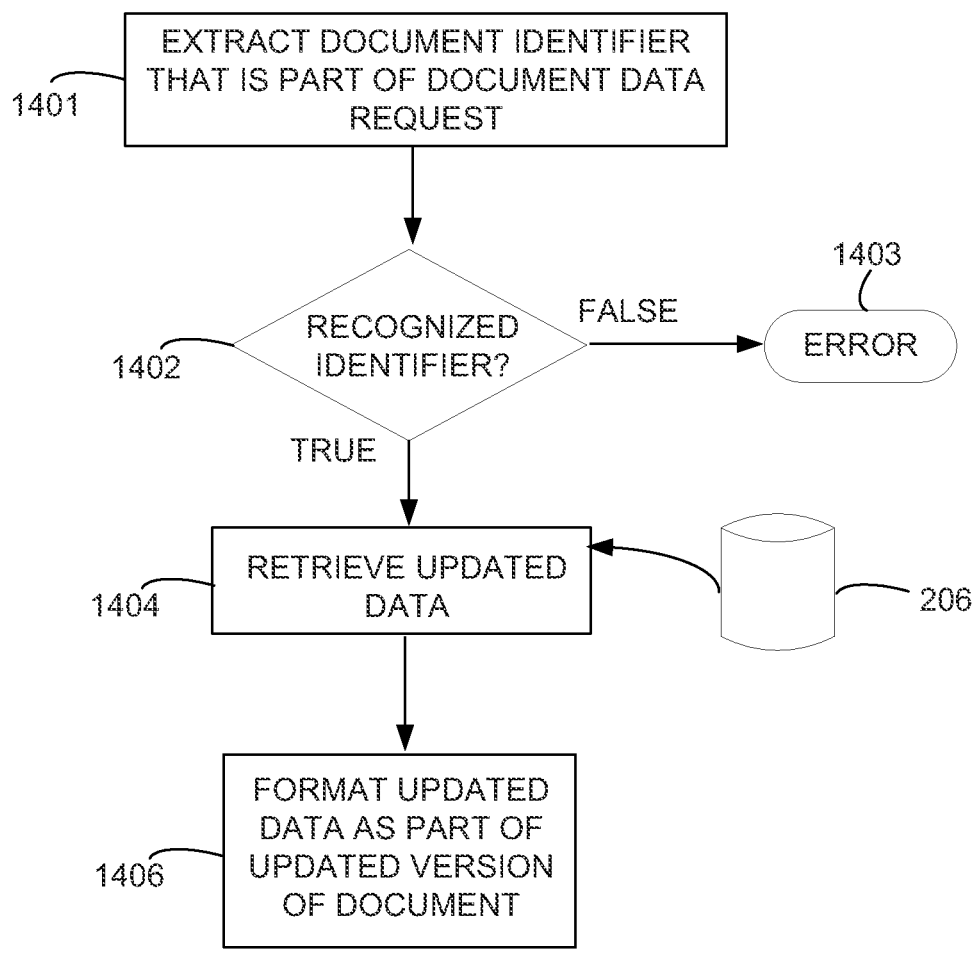
FIG. 14 is a flow chart illustrating the execution of operation, according to an example embodiment, executed to retrieve an updated version of the document from the database 206.

FIG. 14 is a flow chart illustrating the execution of operation 1205 executed to retrieve an updated version of the document from the database 206. Illustrated is an operation 1401 executed to extract a document identifier that is part of the document data request. This document identifier may be a GUID, public key, private key, hash, or other suitable value. Decision operation 1402 is executed to determine whether the identifier is recognized. In cases where the decision operation 1402 evaluates to "false", an error condition 1403 is generated notifying the requesting form factor (e.g., the tablet device 201, printer 202, mobile computing device 110, or camera 202) that the identifier is invalid and the document, map or photo not recognized. In cases where decision operation 1402 evaluates to "true", an operation 1404 is executed. Operation 1404 is executed to retrieve updated data from the database 206. The updated data may be a new version of the document 207, map 208-211, or the photo 212. Additionally, the updated data may be URL data (e.g., a hyperlink), photo data (e.g., JPEG formatted data), metadata (e.g., HTML, or XML formatted data), comma-delimited data, or some other suitable type of data. Operation 1406 is executed to update the data as part of an updated version of the document.

FIG. 15 is a dual stream How chart illustrating an example method implementing a write logic module 826 to retrieve data from a document using electrical power received via induction, and to store updated data to memory embedded in the document. Shown are operations 1501-1503 and 1507-1508 executed by the mobile computing device 110. Also shown are operations 1504-1506 executed by the at least one server 205 to retrieve updated data. Operation 1501 is executed to transmit a read signal. This read signal may be an inductive charge transmitted by a coil residing on the mobile computing device 110. This operation 1501 may be executed where a physical interaction 213 is detected between the mobile computing device 110 and a document 207, maps 208-211, or photo 212. This determination of a physical interaction 213 can be facilitated by bring a primary coil that is part of the form factor (e.g., mobile computing device 110, tablet device 201, printer 202, or camera 203) into proximity to a second coil 302 that part of the document 207, maps 208-211 or photo 212, thus inducing voltage in the second coil. (See generally, U.S. Pat. No. 7,065,658 titled "Method and apparatus for synchronizing and recharging a connector-less portable computer system" which is incorporated by reference in its entirety.) Where voltage is induced, a voltage detector determines that voltage is flowing to the second coil denoting a physical interaction. In some example embodiments, a Hall-effect sensor is used in combination with the second coil 302 to make the determination that a physical interaction 213 has occurred. Operation 1502 is executed to retrieve data from the document 207, maps 208-211 or photo 212. This data may be metadata, security information (e.g., a public or private key common to an asymmetric or symmetric encryption regime), a GUID value, or some other suitable data. The data may be retrieved via active RF utilizing electrical power received via induction, or via an optional battery such as the thin-film battery 301. This optional thin-film battery 301 may be charged via inductive power supplied via the mobile computing device 110 or other suitable form factor. Operation 1503 is executed to transmit the data as part of a document data request. Operation 1504 is executed to receive the data request. Operation 1505 is executed to retrieve an updated version of the document from the database 206. In some example embodiments, operation 1505 is executed to retrieve updated data associated with a document. Operation 1506 is executed to transmit the updated data to the requesting device such as the mobile computing device 110, printer 202, tablet device 201, or camera 203. Operation 1507 is executed to receive the updated data. Operation 1508 is executed to write the updated data to the memory 304 of the document 207, maps 208-211 or photo 212.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the "true" spirit and scope of the invention.

What is claimed is:

1. An apparatus comprising:
    a coil to inductively receive electrical power from an electronic device;
    a non-volatile memory that includes a first version of data relating to the apparatus, the non-volatile memory supplied with the electrical power;
    a document into which the coil and the non-volatile memory are embedded, the document having a printing surface on which information is printed, wherein the first version of the data in the memory represents text written to the surface of the document;
    a radio-frequency (RF) transceiver in the document to transmit the first version of the data to the electronic device, and to receive an updated version of the data based on the first version of the data from the electronic device, wherein the updated version of the data represents additional text to be displayed on the document or printed on the document with the first version of the data; and
    a memory controller to write the updated version of the data to the non-volatile memory.

2. The apparatus of claim 1, further comprising a battery that is charged by the electrical power.

3. The apparatus of claim 1, wherein the RF transceiver is to receive an active Radio Frequency Identifier (RFID) request.

4. A computer system comprising:
    a coil to inductively send electrical power to a document that includes an additional coil;
    a first transceiver to receive a first version of data from the document, the document to receive the electrical power via the additional coil and to transmit the first version of the data to the computer system using the electrical power, wherein the first version of the data represents text written to a surface of the document; and
    a second transceiver to receive additional data over a network, the additional data being an updated version of the first version of the data received from the document, and wherein the updated version of the data represents additional text to be displayed on the document or printed on the document with the first version of the data, and
    wherein the first transceiver transmits the updated version of the data to the document to cause writing of the updated version of the data to a non-volatile memory embedded in the document.

5. The computer system of claim 4, further comprising a screen to display the additional data.

6. The computer system of claim 4, wherein the first version of the data received from the document comprises a first version of a map including geographic map points, and the additional data comprises an updated version of the map.

7. A method comprising:
    transmitting, by a computer, electrical power to a document through induction;
    receiving, by the computer using radio frequency (RF) communication, a first version of data from the document, wherein the first version of the data represents text written to a surface of the document;
    transmitting, by the computer, the first version of the data across a network;
    receiving, by the computer, additional data from the network, the additional data responsive to the transmitted first version of the data and including an updated version of the data, wherein the updated version of the data represents additional text to be displayed on the document or printed on the document with the first version of the data; and
    transmitting, by the computer using RF communication, the additional data to the document to cause writing of the additional data including the updated version of the data to memory in the document.

8. The method of claim 7, further comprising displaying the additional data by the computer.

9. The method of claim 7, wherein the additional data further includes at least one of a hash, a private key, a Globally Unique Identifier (GUID), or a public key.

10. The method of claim 9, wherein the receiving of the first version of the data includes use of active Radio Frequency Identification (RFID).

11. The apparatus of claim 1, wherein the first version of the data comprises a first version of a map that includes geographic map points, and the updated version of the data comprises an updated version of the map.

12. The apparatus of claim 1, wherein the first version of the data comprises a first version of a photo, and the updated version of the data comprises an updated version of the photo.

13. The computer system of claim 4, wherein the first version of the data received from the document is a first version of a photo, and the additional data is an updated version of the photo.

14. The method of claim 7, further comprising printing the additional data by the computer.

15. The method of claim 7, wherein receiving the first version of the data comprises receiving a first version of a map including geographic map points, and wherein transmitting the additional data comprises transmitting the additional data including an updated version of the map.

16. The method of claim 7, wherein receiving the first version of the data comprises receiving a first version of a photo, and wherein transmitting the additional data comprises transmitting the additional data including an updated version of the photo.

* * * * *